United States Patent
Kuramoto

(10) Patent No.: US 9,396,905 B2
(45) Date of Patent: Jul. 19, 2016

(54) IMAGE EVALUATION METHOD AND CHARGED PARTICLE BEAM DEVICE

(71) Applicant: JEOL Ltd., Tokyo (JP)

(72) Inventor: Tatsuru Kuramoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/932,069

(22) Filed: Nov. 4, 2015

(65) Prior Publication Data

US 2016/0133434 A1    May 12, 2016

(30) Foreign Application Priority Data

Nov. 7, 2014    (JP) ................................ 2014-227191

(51) Int. Cl.
  *H01J 37/22*    (2006.01)
  *H01J 37/285*    (2006.01)

(52) U.S. Cl.
  CPC ............ *H01J 37/222* (2013.01); *H01J 37/285* (2013.01)

(58) Field of Classification Search
  USPC ................................................ 250/306, 307
  See application file for complete search history.

(56) References Cited

U.S. PATENT DOCUMENTS

| 2007/0098248 | A1 | 5/2007 | Toyoda et al. |
| 2009/0283677 | A1* | 11/2009 | Ikku .................... G01N 23/2208 250/307 |
| 2011/0038527 | A1 | 2/2011 | Liu |
| 2012/0081712 | A1 | 4/2012 | Laengle |
| 2012/0328151 | A1 | 12/2012 | Warschauer et al. |
| 2015/0041649 | A1 | 2/2015 | Wang |
| 2015/0199583 | A1 | 7/2015 | Nagatomo et al. |

FOREIGN PATENT DOCUMENTS

| JP | 2008270073 A | 11/2008 |
| WO | 2013129148 A1 | 9/2013 |
| WO | 2014017337 A1 | 1/2014 |

* cited by examiner

*Primary Examiner* — Kiet T Nguyen
(74) *Attorney, Agent, or Firm* — The Webb Law Firm

(57) ABSTRACT

An image evaluation method includes: a template image acquisition step that designates part of a reference image to acquire a template image; a first comparative image acquisition step that acquires a first comparative image in which the position of the template image is moved in a first direction by a first moving amount relative to the reference image; a first evaluation step that performs a pattern matching process on the template image and the first comparative image and evaluates the template image; a second comparative image acquisition step that acquires a second comparative image in which the position of the template image is moved in a second direction that is orthogonal to the first direction by a second moving amount relative to the reference image; and a second evaluation step that performs the pattern matching process on the template image and the second comparative image and evaluates the template image.

16 Claims, 12 Drawing Sheets

IMAGE EVALUATION METHOD AND CHARGED PARTICLE BEAM DEVICE

Japanese Patent Application No. 2014-227191 filed on Nov. 7, 2014, is hereby incorporated by reference in its entirety.

BACKGROUND OF THE INVENTION

The present invention relates to an image evaluation method and a charged particle beam device.

When performing a three-dimensional image reconstruction process that utilizes a focused ion beam scanning electron microscope (FIB-SEM), energy-dispersive X-ray spectrometry, wavelength-dispersive X-ray spectrometry, electron backscatter diffraction, or the like, it is necessary to continuously acquire an image using an electron microscope and store analysis result data for a long time.

In order to carry out above analysis, inspection and process, a technique which can maintain the electron beam irradiation area constant is necessary, because data is acquired for a long time and in particular a destructive inspection which utilizes an FIB-SEM must process the specimen without fail. One of the methods that corrects the electron beam irradiation position using a pattern matching process is known as a method for maintaining an electron beam irradiation area constant.

For example, JP-A-2008-270073 discloses a technique that reconstructs a three-dimensional image using an FIB-SEM, wherein a correction mark is formed in advance using a focused ion beam, and a pattern matching process is performed using the correction mark as a reference to correct the irradiation position.

More specifically, the correction mark is formed on the specimen using the FIB, the specimen is subjected to an FIB etching process to expose the cross section of the specimen, and then the exposed cross section is observed using the SEM so that the correction mark is included within the field of view to acquire a cross-sectional image. After performing the pattern matching process using the correction mark as a reference to correct the irradiation position, the specimen is subjected to the FIB etching process again to expose the cross section of the specimen, and the exposed cross section is observed using the SEM. This process is repeated to acquire a plurality of cross-sectional images for which the effect of drift is reduced. This makes it possible to accurately lay the plurality of cross-sectional images one on top of another to reconstruct a three-dimensional image.

The pattern matching process is performed by comparing a template image (that is part of an image (reference image) acquired in advance) and an image photographed under the same observation conditions (e.g., accelerating voltage and magnification) as those used for the reference image to determine the shift amount and the shift direction, for example.

Nevertheless, what kind of an image is appropriate for a template highly depends on the matching technique, and it is difficult to determine it unless a user is familiar and has lots of experience with matching technique. If the template is not appropriate, it is difficult to accurately perform the pattern matching process with respect to the comparative image and accurately determine the shift amount and the shift direction between the images.

Therefore, it is necessary to determine (evaluate) whether or not the template image is appropriate by continuously acquiring an image and performing the pattern matching process. In this case the user must always monitor whether or not the pattern matching process is accurately performed, and the device normally operates. This has imposed a significant burden on the user.

In view of above, an evaluation method has been desired that allows a user who is unfamiliar and does not have experience with the matching technique to determine (evaluate) whether or not the template image used for the pattern matching process is appropriate without continuously acquiring an image and performing the pattern matching process, for example.

SUMMARY

Several aspects of the invention may provide an image evaluation method that can evaluate a template image used for the pattern matching process. Several aspects of the invention may provide a charged particle beam device that can evaluate the template image used for the pattern matching process.

According to a first aspect of the invention, there is provided an image evaluation method that evaluates a template image used for a pattern matching process that is implemented in a charged particle beam device, the image evaluation method comprising:

a template image acquisition step that designates part of a reference image to acquire the template image;

a first comparative image acquisition step that acquires a first comparative image in which a position of the template image is moved in a first direction by a first moving amount relative to the reference image;

a first evaluation step that performs the pattern matching process on the template image and the first comparative image and evaluates the template image;

a second comparative image acquisition step that acquires a second comparative image in which the position of the template image is moved in a second direction that is orthogonal to the first direction by a second moving amount relative to the reference image; and a second evaluation step that performs the pattern matching process on the template image and the second comparative image and evaluates the template image.

According to a second aspect of the invention, there is provided an image evaluation method that evaluates a template image used for a pattern matching process that is implemented in a charged particle beam device, the image evaluation method comprising:

a template image acquisition step that designates part of a reference image to acquire the template image;

a comparative image acquisition step that acquires a comparative image in which a position of the template image is moved in a first direction by a first moving amount and in a second direction that is orthogonal to the first direction by a second moving amount relative to the reference image; and an evaluation step that performs the pattern matching process on the template image and the comparative image and evaluates the template image.

According to a third aspect of the invention, there is provided a charged particle beam device that applies a charged particle beam to a specimen to acquire an image, the charged particle beam device comprising:

an image acquisition section that acquires a template image obtained by designating part of a reference image, a first comparative image in which a position of the template image is moved in a first direction by a first moving amount relative to the reference image, and a second comparative image in which the position of the template image is moved in a second direction that is orthogonal to the first direction by a second moving amount relative to the reference image; and an evaluation section that performs a pattern matching process on the template image and at least one of the first comparative image and the second comparative image and evaluates the template image.

According to a fourth aspect of the invention, there is provided a charged particle beam device that applies a charged particle beam to a specimen to acquire an image, the charged particle beam device comprising:

an image acquisition section that acquires a template image obtained by designating part of a reference image and a comparative image in which a position of the template image is moved in a first direction by a first moving amount and in a second direction that is orthogonal to the first direction by a second moving amount relative to the reference image; and an evaluation section that performs a pattern matching process on the template image and the comparative image and evaluates the template image.

Figure 1:
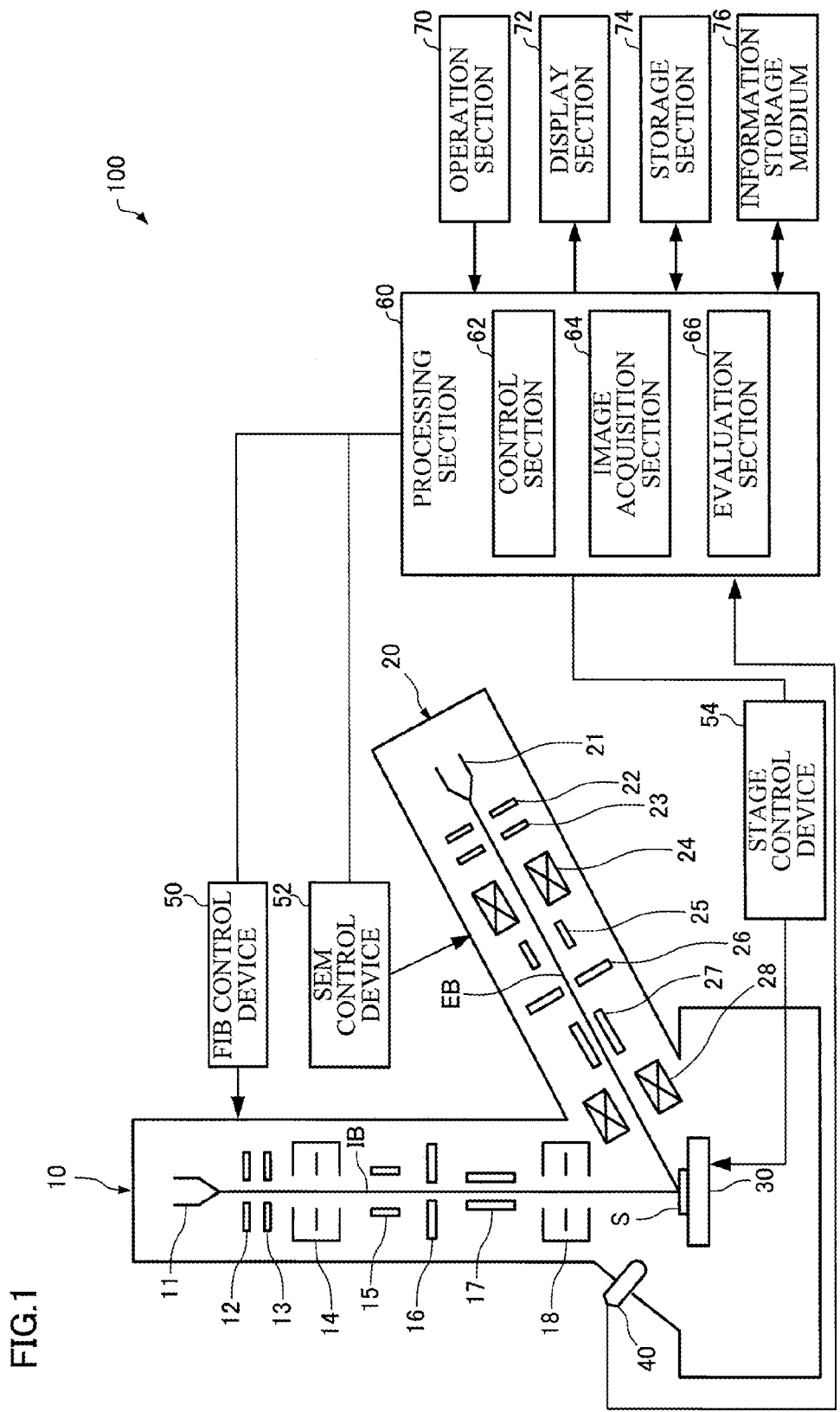
FIG. 1 is a view schematically illustrating the configuration of a charged particle beam device according to the first embodiment.

DETAILED DESCRIPTION OF THE EMBODIMENT (1) According to one embodiment of the invention, an image evaluation method that evaluates a template image used for a pattern matching process that is implemented in a charged particle beam device, the image evaluation method comprising:

a template image acquisition step that designates part of a reference image to acquire the template image;

a first comparative image acquisition step that acquires a first comparative image in which a position of the template image is moved in a first direction by a first moving amount relative to the reference image;

a first evaluation step that performs the pattern matching process on the template image and the first comparative image and evaluates the template image;

a second comparative image acquisition step that acquires a second comparative image in which the position of the template image is moved in a second direction that is orthogonal to the first direction by a second moving amount relative to the reference image; and a second evaluation step that performs the pattern matching process on the template image and the second comparative image and evaluates the template image.

The image evaluation method can evaluate the template image used for the pattern matching process. The image evaluation method can also evaluate the template image in the X-direction and the template image in the Y-direction. Therefore, it is possible to determine the direction in which the template image has less features.

(2) In the image evaluation method, the first evaluation step may calculate a shift amount between the position of the template image in the reference image and the position of the template image in the first comparative image by performing the pattern matching process and evaluates the template image from a ratio of the shift amount to the first moving amount, and the second evaluation step calculates a shift amount between the position of the template image in the reference image and the position of the template image in the second comparative image by performing the pattern matching process and evaluates the template image from a ratio of the shift amount to the second moving amount.

The image evaluation method can thus evaluate the template image in the X-direction and the template image in the Y-direction.

(3) In the image evaluation method, the first comparative image acquisition step may acquire the first comparative image by photographing the first comparative image after moving an observation field of view using the charged particle beam device, and the second comparative image acquisition step acquires the second comparative image by photographing the second comparative image after moving the observation field of view using the charged particle beam device.

The image evaluation method can thus acquire the first comparative image and the second comparative image by photographing the first comparative image and the second comparative image using the charged particle beam device.

(4) In the image evaluation method, the first comparative image acquisition step may acquire the first comparative image by moving a field of view by performing image processing on the reference image, and the second comparative image acquisition step acquires the second comparative image by moving the field of view by performing image processing on the reference image.

According to this configuration, since the first comparative image and the second comparative image can be acquired by performing image processing, the time required for photographing can be reduced as compared with the case of acquiring the first comparative image and the second comparative image by photographing the first comparative image and the second comparative image using the charged particle beam device, for example. Therefore, it is possible to efficiently evaluate the template image.

(5) According to another embodiment of the invention, an image evaluation method that evaluates a template image used for a pattern matching process that is implemented in a charged particle beam device, the image evaluation method comprising:

a template image acquisition step that designates part of a reference image to acquire the template image;

a comparative image acquisition step that acquires a comparative image in which a position of the template image is moved in a first direction by a first moving amount and in a second direction that is orthogonal to the first direction by a second moving amount relative to the reference image; and an evaluation step that performs the pattern matching process on the template image and the comparative image and evaluates the template image.

The image evaluation method can thus evaluate the template image used for the pattern matching process. The image evaluation method can also evaluate the template image in the X-direction and the template image in the Y-direction. Therefore, it is possible to determine the direction in which the template image has less features.

Moreover, since the template image can be evaluated using one comparative image, the time required to acquire the comparative image can be reduced as compared with the case of evaluating the template image using two comparative images, for example.

(6) In the image evaluation method, the evaluation step may calculate a shift amount in the first direction and a shift amount in the second direction between the position of the template image in the reference image and the position of the template image in the comparative image by performing the pattern matching process and evaluates the template image from at least one of a ratio of the shift amount in the first direction to the first moving amount and a ratio of the shift amount in the second direction to the second moving amount.

The image evaluation method can thus evaluate the template image in the X-direction and the template image in the Y-direction.

(7) In the image evaluation method, the comparative image acquisition step may acquire the comparative image by photographing the comparative image after moving an observation field of view using the charged particle beam device. The image evaluation method can thus acquire the comparative image used to evaluate the template image by photographing the comparative image using the charged particle beam device.

(8) In the image evaluation method, the comparative image acquisition step may acquire, the comparative image by moving a field of view by performing image processing on the reference image.

According to this configuration, since the comparative image can be acquired by performing image processing, the time required for photographing can be reduced as compared with the case of acquiring the comparative image by photographing the comparative image using the charged particle beam device, for example. Therefore, it is possible to efficiently evaluate the template image.

(9) According to another embodiment of the invention, a charged particle beam device that applies a charged particle beam to a specimen to acquire an image, the charged particle beam device comprising:

an image acquisition section that acquires a template image obtained by designating part of a reference image, a first comparative image in which a position of the template image is moved in a first direction by a first moving amount relative to the reference image, and a second comparative image in which the position of the template image is moved in a second direction that is orthogonal to the first direction by a second moving amount relative to the reference image; and an evaluation section that performs a pattern matching process on the template image and at least one of the first comparative image and the second comparative image and evaluates the template image.

The charged particle beam device can thus evaluate the template image used for the pattern matching process. The charged particle beam device can also evaluate the template image in the X-direction and the template image in the Y-direction. Therefore, it is possible to determine the direction in which the template image has less features.

(10) In the charged particle beam device, the evaluation section may calculate a shift amount between the position of the template image in the reference image and the position of the template image in the first comparative image by performing the pattern matching process, evaluates the template image from a ratio of the shift amount between the position of the template image in the reference image and the position of the template image in the first comparative image to the first moving amount, calculates a shift amount between the position of the template image in the reference image and the position of the template image in the second comparative image by performing the pattern matching process, and evaluates the template image from a ratio of the shift amount between the position of the template image in the reference image and the position of the template image in the second comparative image to the second moving amount.

(11) In the charged particle beam device, the first comparative image and the second comparative image may be images photographed after moving an observation field of view.

(12) In the charged particle beam device, the first comparative image and the second comparative image may be images obtained by moving a field of view by performing image processing on the reference image.

(13) According to another embodiment of the invention, a charged particle beam device that applies a charged particle beam to a specimen to acquire an image, the charged particle beam device comprising:

an image acquisition section that acquires a template image obtained by designating part of a reference image and a comparative image in which a position of the template image is moved in a first direction by a first moving amount and in a second direction that is orthogonal to the first direction by a second moving amount relative to the reference image; and an evaluation section that performs a pattern matching process on the template image and the comparative image and evaluates the template image.

The charged particle beam device can thus evaluate the template image used for the pattern matching process. The charged particle beam device can also evaluate the template image in the first direction and evaluate the template image in the second direction. Therefore, it is possible to determine the direction in which the template image has less features.

Moreover, since the template image can be evaluated using one comparative image, the time required to acquire the comparative image can be reduced as compared with the case of evaluating the template image using two comparative images, for example.

(14) In the charged particle beam device, the evaluation section may calculate a shift amount in the first direction and a shift amount in the second direction between the position of the template image in the reference image and the position of the template image. in the comparative image by performing the pattern matching process, and evaluates the template image from at least one of a ratio of the shift amount in the first direction to the first moving amount and a ratio of the shift amount in the second direction to the second moving amount.

(15) In the charged particle beam device, the comparative image may be an image photographed after moving an observation field of view.

(16) In the charged particle beam device, the comparative image may be an image obtained by moving a field of view by performing image processing on the reference image.

The embodiments of the invention are described in detail below with reference to the drawings. The following embodiments do not unduly limit the scope of the invention as stated in the claims. Moreover, all the elements described below should not necessarily be taken as essential elements of the invention.

1. First Embodiment

1.1. Charged Particle Beam Device

A charged particle beam device according to a first embodiment of the invention is described below with reference to the drawings. FIG. 1 is a view schematically illustrating the configuration of a charged particle beam device 100 according to the first embodiment.

As illustrated in FIG. 1, the charged particle beam device 100 is a dual-beam (DB) device that includes a focused ion beam (FIB) system and a scanning electron microscope (SEM). The charged particle beam device 100 allows processing of a specimen S using the FIB system and photographing (observing) of the specimen S using the SEM.

The charged particle beam device 100 includes a focused ion beam optical system 10, an electron beam optical system 20, a specimen stage 30, a secondary electron detector 40, an FIB control device 50, an SEM control device 52, a stage control device 54, a processing section 60, an operation section 70, a display section 72, a storage section 74, and an information storage medium 76.

The focused ion beam optical system 10 includes an ion source 11, an extracting electrode 12, an accelerating electrode 13, a condenser lens 14, a beam blanking electrode 15, a variable multi-aperture 16, a beam deflection electrode 17, and an objective lens 18.

The ion source 11 generates an ion beam IB. The extracting electrode 12 is an electrode for extracting ions from the ion source 11. The accelerating electrode 13 is an electrode that accelerates the ions extracted from the ion source 11 via the extracting electrode 12.

The ion source 11, the extracting electrode 12, and the accelerating electrode 13 form an ion gun that generates the ion beam IB. The ion gun is configured so that the ions extracted from the ion source 11 via the extracting electrode 12 are accelerated by the accelerating electrode 13 to emit the ion beam IB that is accelerated by a given accelerating voltage.

The condenser lens 14 focuses the ion beam IB generated by the ion source 11 (ion gun). An electrostatic lens is used as the condenser lens 14.

The beam blanking electrode 15 enables or disables the application of the ion beam IB focused by the condenser lens 14 to the specimen S.

The variable multi-aperture 16 selectively limits the current of the ion beam IB for which the application is enabled by the beam blanking electrode 15.

The beam deflection electrode 17 deflects the ion beam IB for which the current is selectively limited by the variable multi-aperture 16. It is possible to two-dimensionally scan the specimen S with the ion beam IB by deflecting the ion beam IB using the beam deflection electrode 17.

The objective lens 18 is a lens that focuses the ion beam IB on the specimen S. An electrostatic lens is used as the objective lens 18.

The charged particle beam device 100 can process (etch) the specimen S by applying the ion beam IB to the specimen S using the focused ion beam optical system 10.

The electron beam optical system 20 includes an electron source 21, an extracting electrode 22, an accelerating electrode 23, a condenser lens 24, a beam blanking electrode 25, an aperture 26, a beam deflector 27, and an objective lens 28.

The electron source 21 generates an electron beam EB. The extracting electrode 22 is an electrode for extracting electrons from the electron source 21. The accelerating electrode 23 accelerates the electrons extracted from the electron source 21 via the extracting electrode 22.

The electron source 21, the extracting electrode 22, and the accelerating electrode 23 form an electron gun that generates the electron beam EB. The electron gun is configured so that the electrons extracted from the electron source 21 via the extracting electrode 22 are accelerated by the accelerating electrode 23 to emit the electron beam EB that is accelerated by a given accelerating voltage. Note that the configuration of the electron gun is not particularly limited. For example, a thermionic-emission electron gun, a thermal field-emission electron gun, a cold cathode field-emission electron gun, or the like may be used as the electron gun.

The condenser lens 24 focuses the electron beam EB generated by the electron source 21 (electron gun). An electromagnetic lens is used as the condenser lens 24.

The beam blanking electrode 25 enables or disables the application of the electron beam EB focused by the condenser lens 24 to the specimen S.

The aperture 26 selectively limits the current of the electron beam EB for which the application is enabled by the beam blanking electrode 25.

The beam deflector 27 is a member that deflects the electron beam EB to scan the specimen S with the electron beam EB focused by the condenser lens 24 and the objective lens 28.

The objective lens 28 is a lens that focuses the electron beam EB on the specimen S. An electromagnetic lens is used as the objective lens 28.

The charged particle beam device 100 can acquire an SEM image by scanning the specimen S with the electron beam EB using the electron beam optical system 20.

The specimen stage 30 supports the specimen S. The specimen stage 30 can two-dimensionally move the specimen S in the horizontal direction (XY direction). The specimen stage 30 can also rotate or tilt the specimen S.

The secondary electron detector 40 detects secondary electrons generated by the specimen S when the ion beam IB or the electron beam EB has been applied to the specimen S. The secondary electron detector 40 includes a scintillator and a photomultiplier, for example. A secondary electron detection signal (intensity signal) detected by the secondary electron detector 40 is transmitted to the processing, section 60 as image data that is synchronized with a scan signal for the electron beam EB, for example. An SEM image is thus obtained.

The FIB control device 50 is a device that controls the members 11, 12, 13, 14, 15, 16, 17, and 18 that form the focused ion beam optical system 10. The FIB control device 50 controls the members 11, 12, 13, 14, 15, 16, 17, and 18 that form the focused ion beam optical system 10 based on a control signal transmitted from a control section 62.

The SEM control device 52 is a device that controls the members 21, 22, 23, 24, 25, 26, 27, and 28 that form the electron beam optical system 20. The SEM control device 52 controls the members 21, 22, 23, 24, 25, 26, 27, and 28 that form the electron beam optical system 20 based on a control signal transmitted from the control section 62.

The stage control device 54 is a device that controls the specimen stage 30. The stage control device 54 controls the specimen stage 30 based on a control signal transmitted from the control section 62.

The operation section 70 acquires an operation signal that corresponds to the operation performed by the user, and transmits the operation signal to the processing section 60. The operation section 70 includes a button, a key, a touch panel display, a microphone, and the like.

The display section 72 displays an image generated by the processing section 60. The function of the display section 72 may be implemented by an LCD, a CRT, or the like. The display section 72 displays an SEM image generated by the processing section 60, for example. The display section 72 also displays the evaluation result for a template image used for a pattern matching process (described later).

The storage section 74 serves as a work area for the processing section 60. The function of the storage section 74 may be implemented by a RAM or the like. The storage section 74 stores a program, data, and the like that cause or allow the processing section 60 to perform various control processes and calculation processes. The storage section 74 is also used to temporarily store the results of calculations performed by the processing section 60 according to a program, for example. The template image used for the pattern matching process (described later), a first comparative image, and a second comparative image may be stored in the storage section 74.

The information storage medium 76 (computer-readable medium) stores a program, data, and the like. The function of the information storage medium 76 may be implemented by an optical disk (CD or DVD), a magneto-optical disk (MO), a magnetic disk, a hard disk, a magnetic tape, a memory (ROM), or the like. The processing section 60 performs various processes according to the first embodiment based on a program (data) stored in the information storage medium 76. The information storage medium 76 may store a program that causes a computer to function as each section of the processing section 60.

The processing section 60 performs various control processes and calculation processes according to the program stored in the information storage medium 76. The processing section 60 functions as the control section 62, an image acquisition section 64, and an evaluation section 66 (described below) by executing the program stored in the information storage medium 76. The function of the processing section 60 may be implemented by hardware such as a processor (e.g., CPU or DSP) or an ASIC (e.g., gate array), or a program. Note that at least part of the processing section 60 may be implemented by hardware (dedicated circuit).

The processing section 60 includes the control section 62, the image acquisition section 64, and the evaluation section 66.

The control section 62 controls the focused, ion beam optical system 10, the electron beam optical system 20, and the specimen stage 30. The control section 62 controls the focused ion beam optical system 10 by performing a process that generates the control signal for controlling the focused ion beam optical system 10 and transmits the control signal to the focused ion beam optical system 10. The control section 62 controls the electron beam optical system 20 and the specimen stage 30 by performing a similar process.

The control section 62 can perform a continuous photographing process that photographs a plurality of cross-sectional images (SEM images) used to reconstruct a three-dimensional image by repeatedly processing the cross section of the specimen S using the FIB system (FIB) and observing the specimen S using the SEM by controlling the focused ion beam optical system 10, the electron beam optical system 20, and the specimen stage 30.

The control section 62 can also perform a process that photographs the first comparative image and the second comparative image by controlling the electron beam optical system 20 and the specimen stage 30. The details of these processes performed by the control section 62 are described later (see "1.2. Image evaluation method").

The image acquisition section 64 acquires the template image, the first comparative image, and the second comparative image.

The template image is a reference image used for the pattern matching process. The first comparative image and the second comparative image are images used to evaluate the template image.

Figure 2:
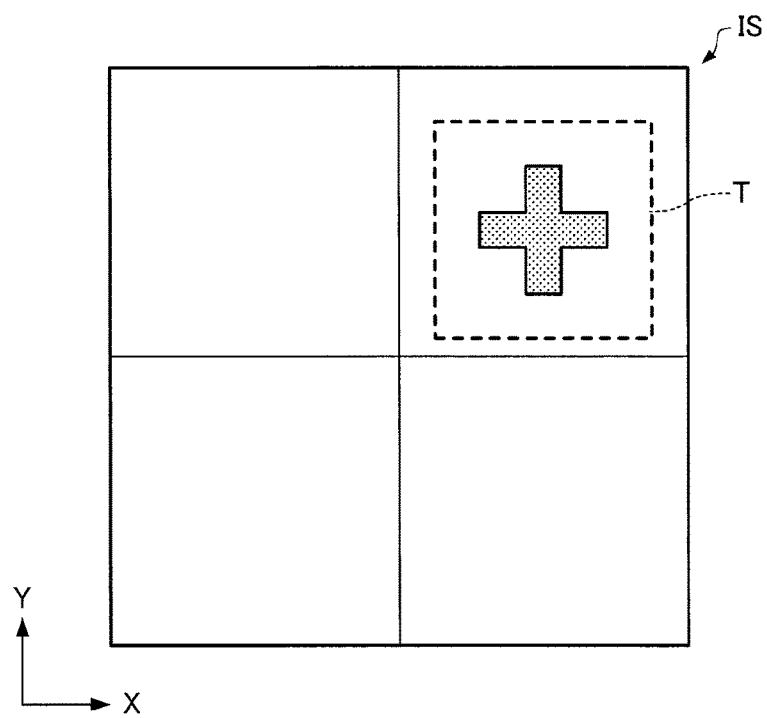
FIG. 2 is a view schematically illustrating an example of a reference image.
Figure 3:
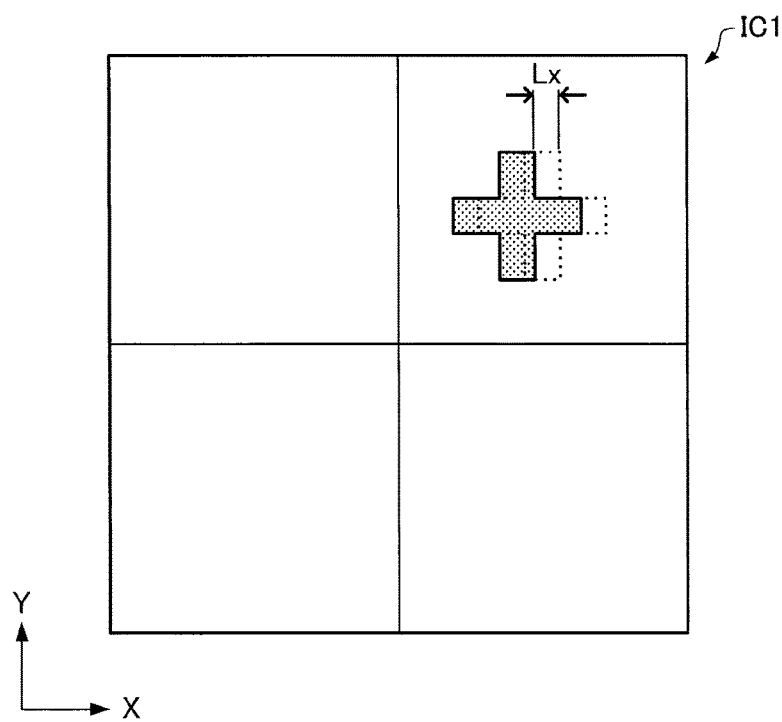
FIG. 3 is a view schematically illustrating an example of a first comparative image.
Figure 4:
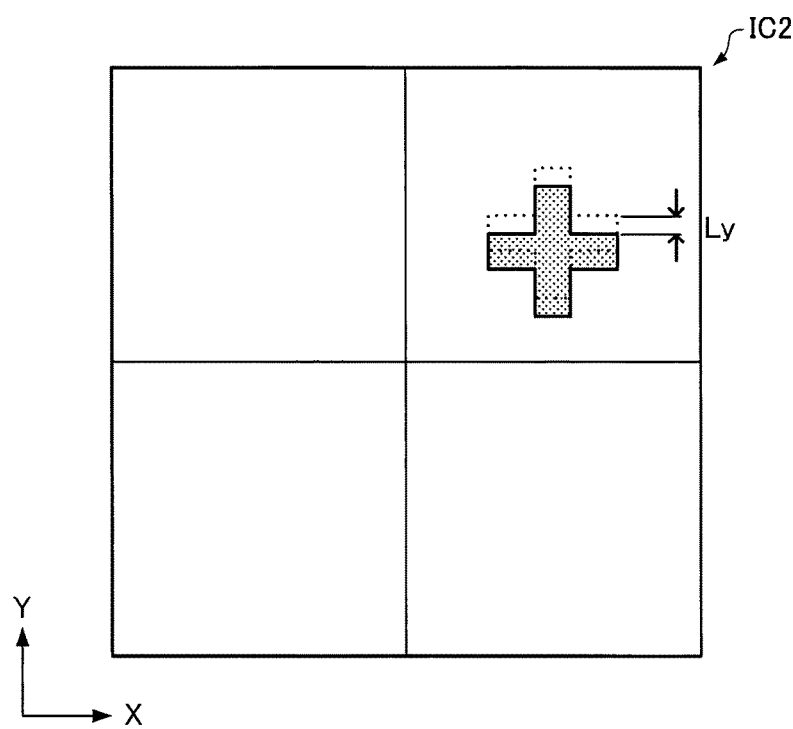
FIG. 4 is a view schematically illustrating an example of a second comparative image.

FIG. 2 is a view schematically illustrating an example of a reference image IS that includes a template image T. FIG. 3 is a view schematically illustrating an example of a first comparative image IC1. FIG. 4 is a view schematically illustrating an example of a second comparative image IC2. In FIGS. 2 to 4, the outer frame defined by the solid line indicates the frame of the SEM image. The X-axis and the Y-axis illustrated in FIGS. 2 to 4 are orthogonal to each other.

As illustrated in FIG. 2, the template image T is an image obtained by designating part of the reference image IS. For example, the template image T is obtained by allowing the user to arbitrarily designate part of the reference image IS (SEM image) obtained by photographing the specimen S using the electron beam optical system 20. The template image T and the reference image IS are stored in the storage section 74, for example. The image acquisition section 64 acquires the template image T from the storage section 74.

As illustrated in FIG. 3, the first comparative image IC1 is an image in which the position of the template image T is moved in the X-direction (first direction) by a first moving amount Lx relative to the reference image IS. Specifically, the first comparative image IC1 is an image in which the position of the template image T is moved in the X-direction by the first moving amount Lx from the position of the template image T in the reference image IS. For example, the first comparative image IC1 is obtained by photographing the specimen S after moving the observation field of view from the observation field of view which is used when photographing the reference image IS, using the charged particle beam device 100.

As illustrated in FIG. 4, the second comparative image IC2 is an image in which the position of the template image T is moved in the Y-direction (second direction) by a second moving amount Ly relative to the reference image IS. Specifically, the second comparative image IC2 is an image in which the position of the template image T is moved in the Y-direction by the second moving amount Ly from the position of the template image T in the reference image IS. For example, the second comparative image IC2 is obtained by photographing the specimen S after moving the observation field of view from the observation field of view which is used when photographing the reference image IS, using the charged particle beam device 100.

It is preferable that the first moving amount Lx and the second moving amount Ly be an amount that corresponds to a given number of pixels. Specifically, it is preferable that the first moving amount Lx and the second moving amount Ly be an amount that corresponds to a given number of pixels, and the moving amount of the specimen S be changed using the specimen stage 30 in synchronization with the observation magnification. For example, when the first moving amount Lx and the second moving amount Ly are set to a fixed value (e.g., 1 micrometer), the first moving amount Lx that corresponds to the first comparative image IC1 and the second moving amount Ly that corresponds to the second comparative image IC2 decrease when the magnification is low, and the pattern matching accuracy deteriorates. It is preferable that the first moving amount Lx and the second moving amount Ly be an amount equal to or larger than 100 pixels from the viewpoint of pattern matching accuracy. The first moving amount Lx and the second moving amount Ly may be either the same or different.

Figure 5:
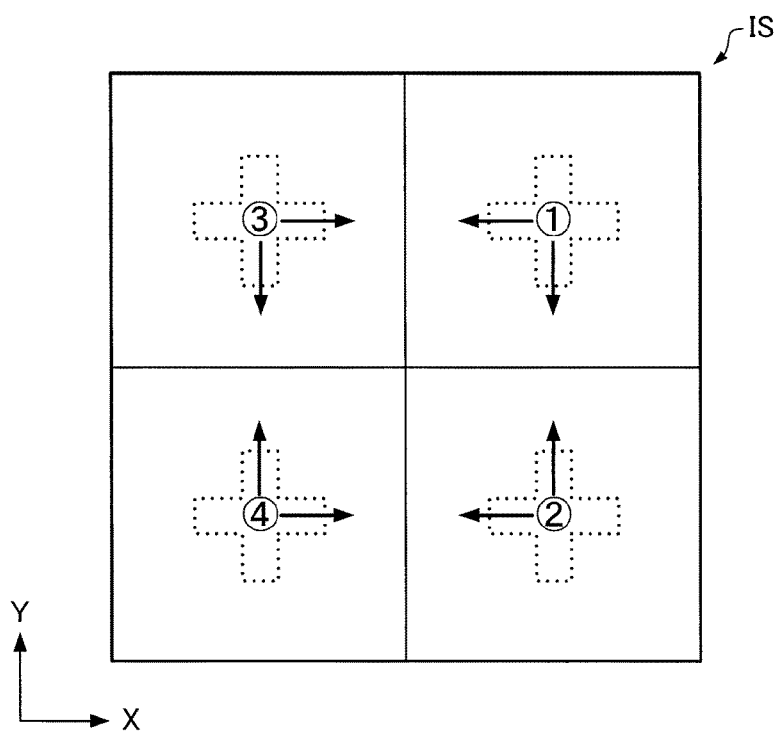
FIG. 5 is a view illustrating a moving direction of a template image in a first comparative image, and a moving direction of a template image in a second comparative image.

FIG. 5 is a view illustrating the moving direction of the template image T in the first comparative image IC1, and the moving direction of the template image T in the second comparative image IC2. As illustrated in FIG. 5, the moving direction of the template image T in the first comparative image IC1 and the moving direction of the template image T in the second comparative image IC2 (i.e., the direction in which the template image T is moved when acquiring the first comparative image IC1 and the second comparative image IC2) are determined corresponding to the quadrant of the reference image IS in which the template image T is situated.

Specifically, the moving direction of the template image T in the first comparative image IC1 is set to the −X-direction, and the moving direction of the template image T in the second comparative image IC2 is set to the −Y-direction, when the template image T is situated in the first quadrant of the reference image IS. The moving direction of the template image T in the first comparative image IC1 is set to the −X-direction, and the moving direction of the template image T in the second comparative image IC2 is set to the +Y-direction, when the template image T is situated in the second quadrant of the reference image IS. The moving direction of the template image T in the first comparative image IC1 is set to the +X-direction, and the moving direction of the template image T in the second comparative image IC2 is set to the −Y-direction, when the template image T is situated in the third quadrant of the reference image IS. The moving direction of the template image T in the first comparative image IC1 is set to the +X-direction, and the moving direction of the template image T in the second comparative image IC2 is set to the +Y-direction, when the template image T is situated in the fourth quadrant of the reference image IS.

It is possible to prevent a situation in which part of the template image T is not observed (or the entire template image T is not observed) in the first comparative image IC1 and the second comparative image IC2 by determining the moving direction of the template image T, when acquiring the first comparative image IC1 and the second comparative image IC2 corresponding to the quadrant of the reference image IS in which the template image T is situated.

The first comparative image IC1 and the second comparative image IC2 are photographed by causing the control section 62 to control the electron beam optical system 20 and the specimen stage 30. The field of view may be moved when photographing the first comparative image IC1 and the second comparative image IC2 by controlling the specimen stage 30, for example. Note that the field of view may be moved when photographing the first comparative image IC1 and the second comparative image IC2 by controlling the beam deflector 27 to implement an image shift. The term "image shift" used herein refers to moving the field of view by deflecting the electron beam EB using the beam deflector 27. The image acquisition section 64 acquires the first comparative image IC1 and the second comparative image IC2 photographed as described above.

The evaluation section 66 performs the pattern matching process on the template image T and the first comparative image IC1 and evaluates the template image T. More specifically, the evaluation section 66 calculates the shift amount between the position of the template image T in the reference image IS and the position of the template image T in the first comparative image IC1 by performing the pattern matching process and evaluates the template image T from the ratio of the shift amount to the first moving amount Lx.

For example, the evaluation section 66 detects the template image T from the first comparative image IC1 by performing the pattern matching process to acquire position information about the template image T in the first comparative image IC1. The evaluation section 66 calculates the shift amount between the template image T in the reference image IS and the template image T in the first comparative image IC1 from the position information about the template image T in the first comparative image IC1 and the position information about the template image T in the reference image IS. The pattern matching process may be implemented using an arbitrary method. For example, the pattern matching process is implemented using a known method such as a normalized correlation method.

The evaluation section 66 then calculates the ratio of the calculated shift amount to the first moving amount Lx that corresponds to the first comparative image IC1. When the calculated shift amount is referred to as Dx, the ratio of the shift amount Dx to the first moving amount Lx is represented by Dx/Lx. The calculated shift amount Dx is ideally identical to the first moving amount Lx (i.e., Dx/Lx=1). Note that the unit for the shift amount Dx and the first moving amount Lx is pixels, for example. It is necessary to take account of the direction (positive or negative) of the shift amount Dx and the first moving amount Lx.

The evaluation section 66 determines that the template image T is appropriate in the X-direction when the ratio Dx/Lx falls within a given range. The evaluation section 66 determines that the template image T is not appropriate in the X-direction when the ratio Dx/Lx falls outside the given range.

The range of the ratio Dx/Lx used as the determination standard may be set arbitrarily. For example, since the movement of the field of view using the specimen stage 30 (i.e., a mechanism that moves the field of view) and the movement of the field of view using the image shift implemented by the beam deflector 27 involve an error, the range of the ratio Dx/Lx used as the determination standard may be determined based on the error. For example, when the mechanism that moves the field of view involves an error of 5%, the determination standard may be set to $0.95 \leq Dx/Lx \leq 1.05$. Specifically, the evaluation section 66 determines that the template image T is appropriate when the inequality is satisfied, and determines that the template image T is not appropriate when the inequality is not satisfied.

Likewise, the evaluation section 66 performs the pattern matching process on the template image T and the second comparative image IC2 and evaluates the template image T. More specifically, the evaluation section 66 calculates the shift amount between the position of the template image T in the reference image IS and the position of the template image T in the second comparative image IC2 by performing the pattern matching process and evaluates the template image T from the ratio of the shift amount to the second moving amount Ly.

For example, the evaluation section 66 detects the template image T from the second comparative image IC2 by performing the pattern matching process to acquire position information about the template image T in the second comparative image IC2. The evaluation section 66 calculates the shift amount Dy between the template image T in the reference image IS and the template image T in the second comparative image IC2 from the position information about the template image T in the second comparative image IC2 and the position information about the template image T in the reference image IS. The evaluation section 66 then calculates the ratio Dy/Ly of the calculated shift amount Dy to the second moving amount Ly that corresponds to the second comparative image IC2 and determines that the template image T is appropriate in the Y-direction when the ratio Dy/Ly falls within a given range. The evaluation section 66 determines that the template image T is not appropriate in the Y-direction when the ratio Dy/Ly falls outside the given range.

The evaluation section 66 performs a control process that displays the evaluation result for the template image T on the display section 72, for example. The evaluation section 66 performs the control process that displays the evaluation result for the template image T in the X-direction and the evaluation result for the template image T in the Y-direction on the display section 72, for example.

1.2. Image Evaluation Method

An image evaluation method that evaluates the template image used for the pattern matching process using the charged particle beam device according to the first embodiment is described below with reference to the drawings. Note that the image evaluation method is described below taking an example in which the image evaluation method that evaluates the template image used for the pattern matching process is applied to the continuous photographing process that is performed by the charged particle beam device 100 and used to reconstruct a three-dimensional image.

Figure 6:
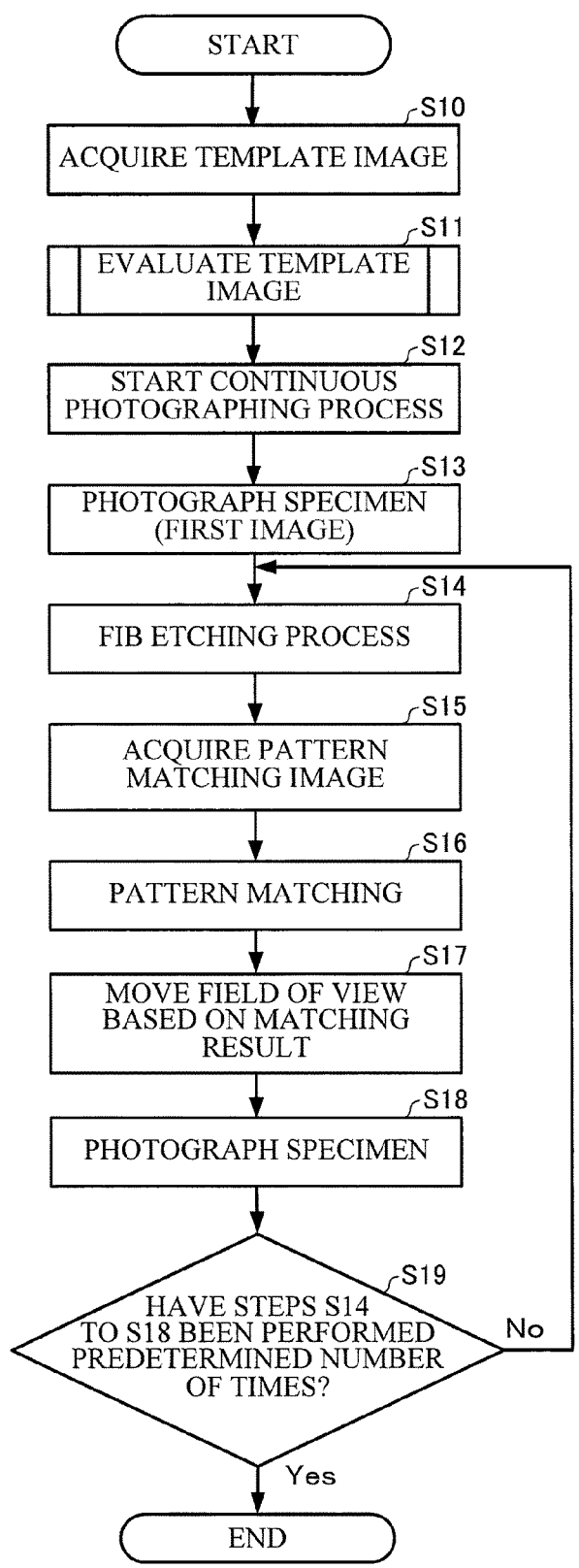
FIG. 6 is a flowchart illustrating an example of a three-dimensional image reconstruction method that is implemented using a charged particle beam device according to the first embodiment.

FIG. 6 is a flowchart illustrating an example of a continuous photographing method that is implemented using the charged particle beam device 100 according to the first embodiment and used to reconstruct a three-dimensional image.

The template image T is acquired (step S10).

The template image T is determined by allowing the user to designate an arbitrary area (e.g., an area that includes a characteristic pattern) from the reference image IS obtained by photographing an arbitrary area of the specimen S using the charged particle beam device 100. The template image T (that is obtained by designating part of the reference image IS) is acquired by the image acquisition section 64.

An image evaluation process that evaluates the template image T is performed (step S11). Note that the image evaluation process is described later.

When the template image T has been evaluated (when the step S11 has been performed), the continuous photographing process that acquires a plurality of cross-sectional images used to construct a three-dimensional image is performed (step S12).

For example, when the user designates an arbitrary area (photographing area) of the specimen S and instructs the processing section 60 to start the continuous photographing process through the operation section 70, the processing section 60 receives the operation signal from the operation section 70 and starts the continuous photographing process. Note that the photographing area may be an area that does not include the template image T, or an area that includes the template image T.

The continuous photographing process (steps S13 to S19) described below is performed by the processing section 60. Specifically, the charged particle beam device 100 automatically performs the continuous photographing process used to reconstruct a three-dimensional image.

The control section 62 controls the electron beam optical system 20 and the specimen stage 30 to photograph the photographing area of the specimen S (step S13). The resulting SEM image (cross-sectional image) is stored in the storage section 74.

The control section 62 then controls the focused ion beam optical system 10 to perform an FIB etching process on the photographing area of the specimen S (step S14). The cross section of the specimen S is thus further exposed.

The control section 62 then controls the electron beam optical system 20 and the specimen stage 30 to photograph (acquire) a pattern matching image (SEM image) (step S15). The pattern matching image is photographed under the same observation conditions (e.g., the position of the specimen S and the observation magnification) as those used for the reference image IS.

The control section 62 performs the pattern matching process on the template image T and the pattern matching image acquired in the step S15 (step S16). The control section 62 thus calculates the shift amount between the template image T within the reference image IS and the template image T within the pattern matching image.

The control section 62 controls the specimen stage 30 based on the result of the pattern matching process to move the field of view (step S17). This makes it possible to correct the shift in the field of view due to the drift of the specimen S or the like, and return the field of view (bring the field of view closer) to the preceding field of view (i.e., the field of view when the specimen S was photographed in the step S13).

The control section 62 then photographs the photographing area of the specimen S using the field of view for which the drift was corrected in the step S17 (step S18). The resulting SEM image (cross-sectional image) is stored in the storage section 74.

The control section 62 then performs a process that determines whether or not the steps S14 to S18 have been performed a predetermined number of times (step S19).

When the steps S14 to S18 have not been performed the predetermined number of times (No in step S19), the control section 62 performs the steps S14 to S19 again.

When the steps S14 to S18 have been performed the predetermined number of times (Yes in step S19), the control section 62 terminates the continuous photographing process.

A plurality of cross-sectional images (SEM images) used to reconstruct a three-dimensional image can be photographed in this manner.

Figure 7:
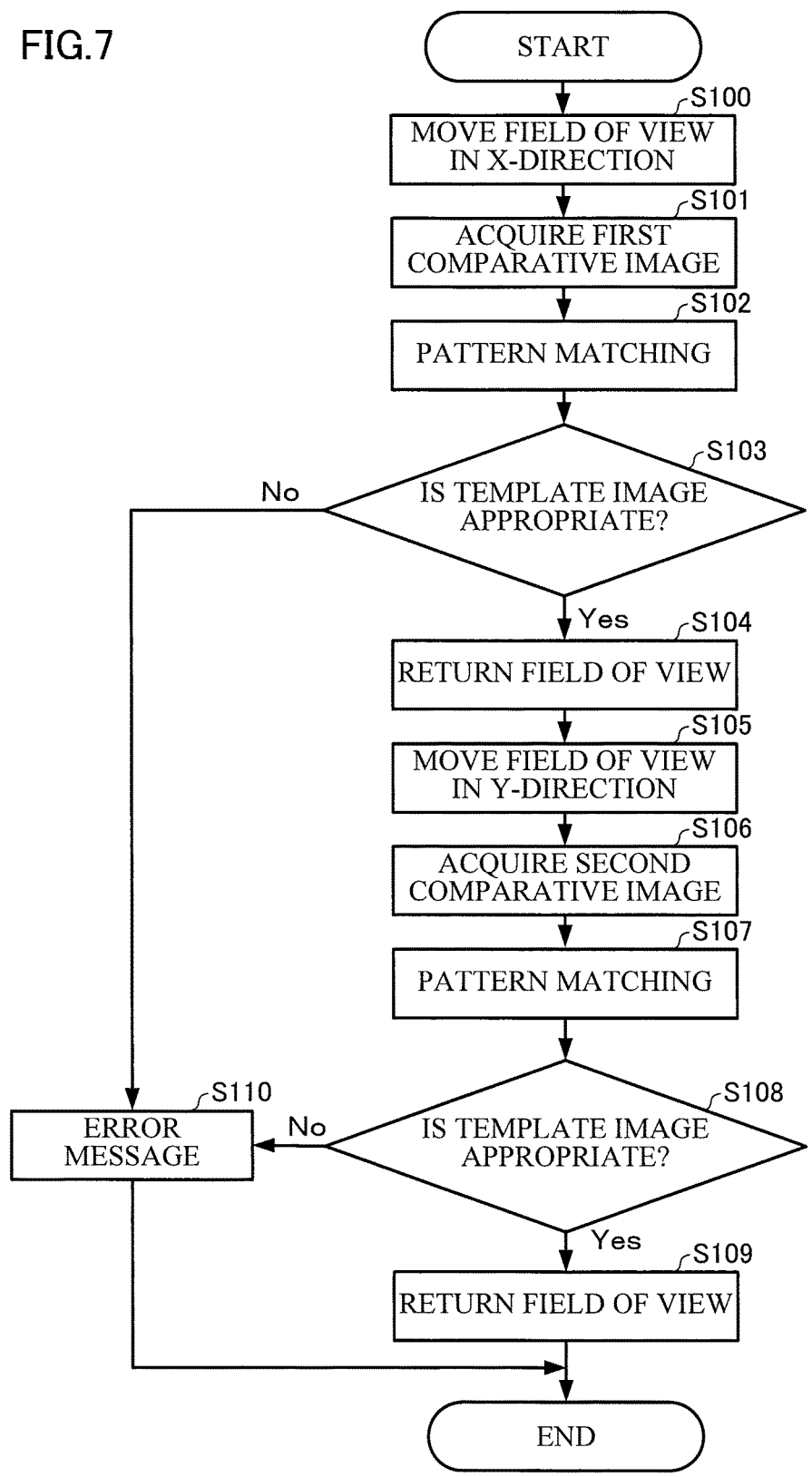
FIG. 7 is a flowchart illustrating an example of an image evaluation method that evaluates a template image used for a pattern matching process using a charged particle beam device according to the first embodiment.

The image evaluation process (step S11) that evaluates the template image is described below. FIG. 7 is a flowchart illustrating an example of the image evaluation method that evaluates the template image used for the pattern matching process using the charged particle beam device 100 according to the first embodiment.

When the template image T has been acquired in the step S10 (see FIG. 6), the control section 62 performs a process that moves the observation field of view in the X-direction (e.g., +X-direction) by a given amount from the observation field of view used when photographing the reference image IS (step S100). The position of the template image T can thus be moved in the X-direction by the first moving amount Lx relative to the position of the template image T in the reference image IS.

For example, the control section 62 moves the observation field of view from the observation field of view used when photographing the reference image IS by moving the specimen S by controlling the specimen stage 30 after the reference image IS was photographed.

Note that the control section 62 may move the observation field of view by utilizing the image shift implemented by the beam deflector 27. This also applies to the subsequent process that moves the field of view (steps S104, S105, and S109) described later.

The image acquisition section 64 then acquires the first comparative image IC1 (step S101). The first comparative image IC1 is photographed by causing the control section 62 to control the electron beam optical system 20 to scan the specimen S with the electron beam EB using the observation field of view achieved in the step S100. The image acquisition section 64 acquires the photographed first comparative image IC1.

The evaluation section 66 performs the pattern matching process on the template image T and the first comparative image IC1 (step S102). The evaluation section 66 thus calculates the shift amount Dx between the position of the template image T in the reference image IS and the position of the template image T in the first comparative image IC1.

The evaluation section 66 then determines whether or not the template image T is appropriate (i.e., evaluates the template image) based on the result of the pattern matching process (step S103). The evaluation section 66 evaluates the template image T from the ratio Dx/Lx of the shift amount Dx calculated in the step S102 to the first moving amount Lx.

When it has been determined that the template image T is appropriate as a result of the pattern matching process (Yes in step S103), the control section 62 performs a process that moves the field of view in the direction (e.g., −X-direction) opposite to the direction used in the step S100 by a given amount by controlling the specimen stage 30 to return the field of view to the original position (i.e., the field of view used when photographing the reference image IS) (step S104).

The control section 62 then performs a process that moves the observation field of view in the Y-direction (e.g., +Y-direction) by a given amount from the observation field of view used when photographing the reference image IS (step S105). The position of the template image T can thus be moved in the Y-direction by the second moving amount Ly relative to the position of the template image T in the reference image IS.

For example, the control section 62 moves the observation field of view by moving the specimen S by controlling the specimen stage 30 after returning the field of view to the original position (after performing the step S104).

The image acquisition section 64 then acquires the second comparative image IC2 (step S106). The second comparative image IC2 is photographed by causing the control section 62 to control the electron beam optical system 20 to scan the specimen S with the electron beam EB using the observation field of view achieved in the step S105. The image acquisition section 64 acquires the photographed second comparative image IC2.

The evaluation section 66 performs the pattern matching process on the template image T and the second comparative image IC2 (step S107). The evaluation section 66 thus calculates the shift amount Dy between the position of the template image T within the reference image IS and the position of the template image T in the second comparative image IC2.

The evaluation section 66 then determines whether or not the template image T is appropriate (i.e., evaluates the template image) based on the result of the pattern matching process (step S108). The evaluation section 66 evaluates the template image T from the ratio Dy/Ly of the shift amount Dy calculated in the step S107 to the second moving amount Ly.

When it has been determined that the template image T is appropriate as a result of the pattern matching process (Yes in step S108), the control section 62 performs a process that moves the field of view in the direction (e.g., −Y-direction) opposite to the direction used in the step S105 by a given amount by controlling the specimen stage 30 to return the field of view to the original position (i.e., the field of view used when photographing the reference image IS) (step S109). The processing section 60 then terminates the image evaluation process.

When it has been determined that the template image T is not appropriate as a result of the pattern matching process (No in step S103 or No in step S108), the evaluation section 66 performs a control process that displays the evaluation result for the template image T in the X-direction and the evaluation result for the template image T in the Y-direction on the display section 72 (i.e., a control process that presents an error message), for example (step S110). The processing section 60 then terminates the image evaluation process.

The template image can be evaluated by performing the above process.

The charged particle beam device 100 has the following features, for example.

The charged particle beam device 100 is configured so that the image acquisition section 64 acquires the template image, the first comparative image, and the second comparative image, and the evaluation section 66 performs the pattern matching process on the template image and at least one of the first comparative image and the second comparative image and evaluates the template image. Therefore, the charged particle beam device 100 can evaluate the template image used for the pattern matching process (i.e., can determine (evaluate) whether or not the pattern matching process can be accurately performed using the template image). The charged particle beam device 100 can evaluate the template image in the X-direction and evaluate the template image in the Y-direction. Therefore, the charged particle beam device 100 can determine the direction in which the template image has less features. The charged particle beam device 100 thus allows a user who is unfamiliar and does not have experience with the matching technique to perform the pattern matching process using an appropriate template image.

The image evaluation method according to the first embodiment has the following features, for example.

The image evaluation method according to the first embodiment includes a template image acquisition step (step S10) that designates part of the reference image to acquire the template image, a first comparative image acquisition step (step S101) that acquires the first comparative image in which the position of the template image is moved in the first direction (X-direction) by the first moving amount Lx relative to the reference image, a first evaluation step (step S103) that performs the pattern matching process on the template image and the first comparative image, and evaluates the template image, a second comparative image acquisition step (step S106) that acquires the second comparative image in which the position of the template image is moved in the second direction (Y-direction) (that is orthogonal to the first direction) by the second moving amount Ly relative to the reference image, and a second evaluation step (step S108) that performs the pattern matching process on the template image and the second comparative image and evaluates the template image. The image evaluation method thus makes it possible to evaluate the template image used for the pattern matching process. The image evaluation method also makes it possible to evaluate the template image in the X-direction and evaluate the template image in the Y-direction.

In the image evaluation method according to the first embodiment, the first comparative image is acquired in the step S101 by photographing the specimen S after moving the observation field of view using the charged particle beam device 100, and the second comparative image is acquired in the step S106 by photographing the specimen S after moving the observation field of view using the charged particle beam device 100. Therefore, the first comparative image and the second comparative image can be acquired by photographing the specimen S using the charged particle beam device 100.

1.3. Modification

A modification of the charged particle beam device 100 according to the first embodiment is described below. Note that the configuration of the charged particle beam device according to the modification is the same as that of the charged particle beam device 100 illustrated in FIG. 1, and description thereof is omitted. The following description focuses on the differences from the charged particle beam device 100, and description of the same features as those of the charged particle beam device 100 is omitted.

The charged particle beam device 100 according to the first embodiment has been described above taking an example in which the image acquisition section 64 acquires the template image, the first comparative image in which the position of the template image is moved in the X-direction by the first moving amount Lx relative to the reference image, and the second comparative image in which the position of the template image is moved in the Y-direction by the second moving amount Ly relative to the reference image, and the evaluation section 66 performs the pattern matching process on the template image and the first comparative image to evaluate the template image in the X-direction, and performs the pattern matching process on the template image and the second comparative image to evaluate the template image in the Y-direction.

According to the modification, the image acquisition section 64 acquires the template image, and a comparative image (hereinafter may be referred to as "third comparative image") in which the position of the template image is moved in the X-direction by the first moving amount and in the Y-direction by the second moving amount relative to the reference image, and the evaluation section 66 performs the pattern matching process on the template image and the third comparative image and evaluates the template image.

Figure 8:
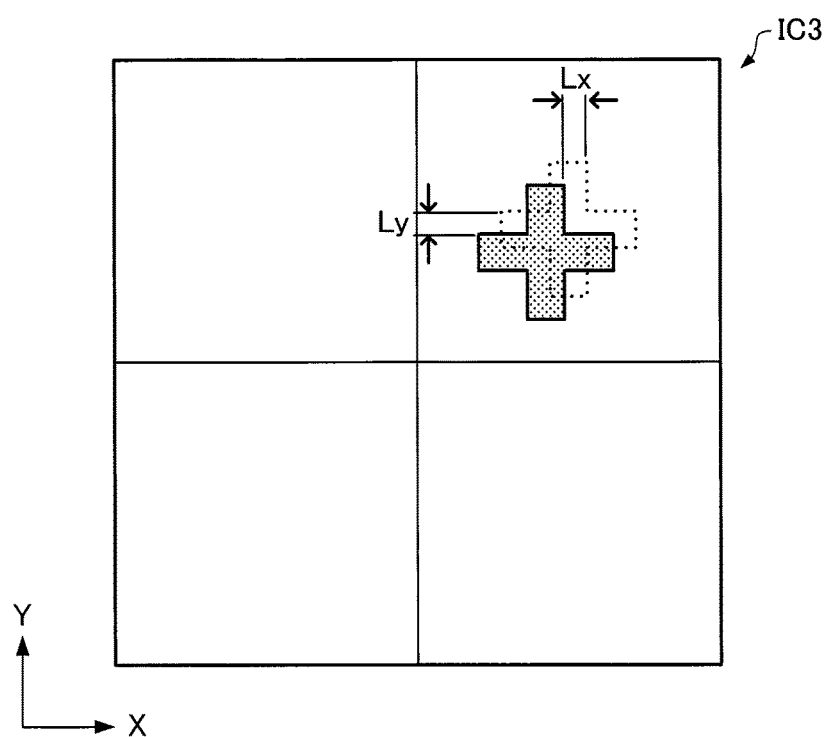
FIG. 8 is a view schematically illustrating an example of a third comparative image.

FIG. 8 is a view schematically illustrating an example of a third comparative image IC3. In FIG. 8, the outer frame defined by the solid line indicates the frame of the SEM image.

As illustrated in FIG. 8, the third comparative image IC3 is an image in which the position of the template image T is moved in the X-direction by the first moving amount Lx and in the Y-direction by the second moving amount Ly relative to the reference image IS (see FIG. 2). Specifically, the third comparative image IC3 is an image in which the position of the template image T is moved in the X-direction by the first moving amount Lx and in the Y-direction by the second moving amount Ly from the position of the template image T in the reference image IS. For example, the third comparative image IC3 is photographed after moving the observation field of view relative to the observation field of view used when photographing the reference image IS using the charged particle beam device 100.

The third comparative image IC3 is photographed by causing the control section 62 to control the electron beam optical system 20 and the specimen stage 30. For example, the observation field of view is moved when photographing the third comparative image IC3 by causing the control section 62 to control the specimen stage 30 or the beam deflector 27.

The evaluation section 66 performs the pattern matching process on the template image T and the third comparative image IC3 and evaluates the template image T. For example, the evaluation section 66 calculates the shift amount Dx in the X-direction and the shift amount Dy in the Y-direction between the position of the template image T in the reference image IS and the position of the template image T in the third comparative image IC3 by performing the pattern matching process. The evaluation section 66 evaluates the template image T from the ratio Dx/Lx of the shift amount Dx in the X-direction to the first moving amount Lx and the ratio Dy/Ly of the shift amount Dy in the Y-direction to the second moving amount Ly.

Figure 9:
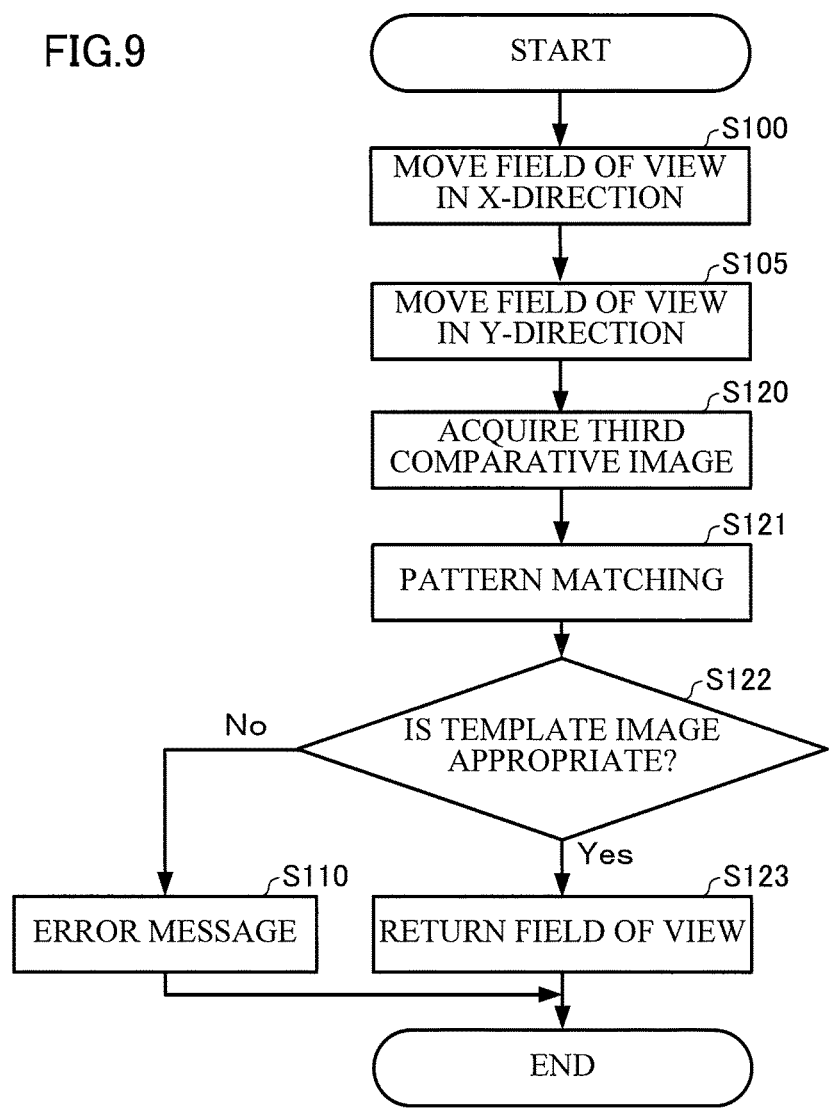
FIG. 9 is a flowchart illustrating an example of an image evaluation method that evaluates a template image used for a pattern matching process using a charged particle beam device according to the modification of the first embodiment.

FIG. 9 is a flowchart illustrating an example of the image evaluation method that evaluates the template image used for the pattern matching process using the charged particle beam device according to the modification. Note that the same steps as those included in the flowchart illustrated in FIG. 7 are indicated by the same reference signs (symbols), and detailed description thereof is omitted.

When the template image T has been acquired in the step S10 (see FIG. 6), the control section 62 performs a process that moves the observation field of view in the X-direction (e.g., +X-direction) by a given amount from the observation field of view used when photographing the reference image IS by controlling the specimen stage 30 (step S100).

The control section 62 then performs a process that moves the observation field of view in the Y-direction (e.g., +Y-direction) by a given amount from the observation field of view achieved in the step S100 by controlling the specimen stage 30 (step S105). The position of the template image T can thus be moved (by the steps S100 and S105) in the X-direction by the first moving amount Lx and in the Y-direction by the second moving amount Ly relative to the position of the template image T in the reference image IS.

The image acquisition section 64 then acquires the third comparative image IC3 (step S120). The third comparative image IC3 is photographed by causing the control section 62 to control the electron beam optical system 20 to scan the specimen S with the electron beam EB using the observation field of view achieved in the step S105, and the image acquisition section 64 acquires the photographed third comparative image IC3.

The evaluation section 66 performs the pattern matching process on the template image T and the third comparative image IC3 (step S121). The evaluation section 66 thus calculates the shift amount Dx in the X-direction and the shift amount Dy in the Y-direction between the position of the template image T in the reference image IS and the position of the template image T in the third comparative image IC3.

The evaluation section 66 then determines whether or not the template image T is appropriate based on the result of the pattern matching process (step S122). The evaluation section 66 evaluates the template image T from the ratio Dx/Lx of the shift amount Dx calculated in the step S121 to the first moving amount Lx and the ratio Dy/Ly of the shift amount Dy calculated in the step S121 to the second moving amount Ly. The evaluation section 66 determines that the template image T is appropriate when it has been determined that the template image T is appropriate in the X-direction and the Y-direction, and determines that the template image T is not appropriate when it has been determined that the template image T is not appropriate in at least one of the X-direction and the Y-direction.

When it has been determined that the template image T is appropriate as a result of the pattern matching process (Yes in step S122), the control section 62 performs a process that returns the field of view to the original position (i.e., the field of view used when photographing the reference image IS) by controlling the specimen stage 30 (step S123). The processing section 60 then terminates the image evaluation process.

When it has been determined that the template image T is not appropriate as a result of the pattern matching process (No in step S122), the evaluation section 66 performs a control process that displays the evaluation result for the template image T in the X-direction and the evaluation result for the template image T in the Y-direction on the display section 72, for example (step S110). The processing section 60 then terminates the image evaluation process.

The template image can be evaluated by performing the above process.

The charged particle beam device and the image evaluation method according to the modification can achieve the same advantageous effects as those achieved by the charged particle beam device and the image evaluation method according to the first embodiment. According to the modification, since the template image can be evaluated using one comparative image, the time required to acquire the comparative image can be reduced as compared with the case of evaluating the template image using two comparative images, for example.

2. Second Embodiment

2.1. Charged Particle Beam Device

Figure 10:
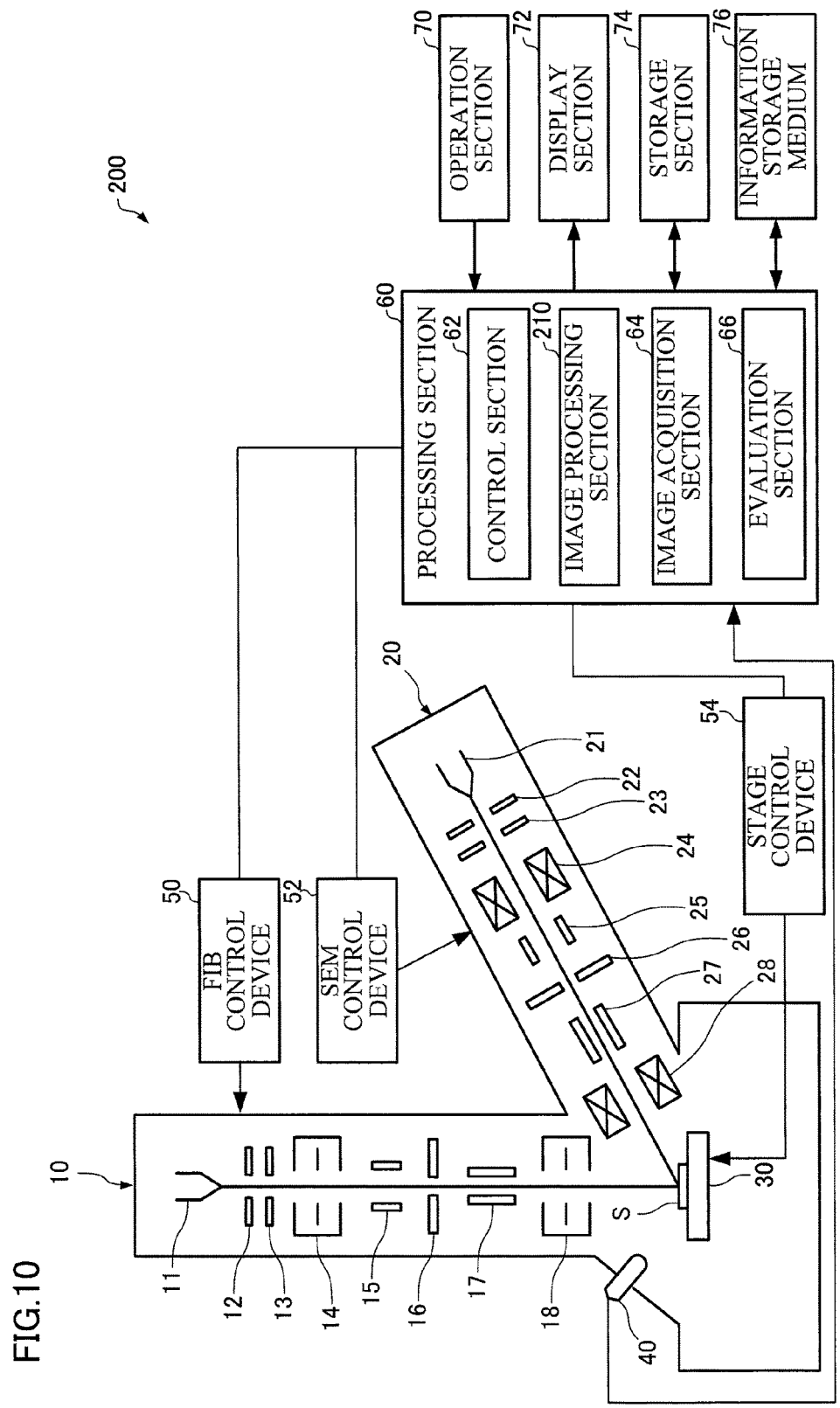
FIG. 10 is a view schematically illustrating the configuration of a charged particle beam device according to the second embodiment.

A charged particle beam device according to a second embodiment of the invention is described below with reference to the drawings. FIG. 10 is a view schematically illustrating the configuration of a charged particle beam device 200 according to the second embodiment. Note that the members having the same functions as those of the charged particle beam device 100 according to the first embodiment are indicated by the same reference signs (symbols), and detailed description thereof is omitted.

The charged particle beam device 100 according to the first embodiment acquires the first comparative image and the second comparative image by photographing the first comparative image and the second comparative image after moving the observation field of view.

The charged particle beam device 200 is configured so that the processing section 60 includes an image processing section 210. The image processing section 210 generates the first comparative image and the second comparative image by moving the field of view by performing image processing on the reference image, and the image acquisition section 64 acquires the first comparative image and the second comparative image generated by the image processing section 210.

Figure 11:
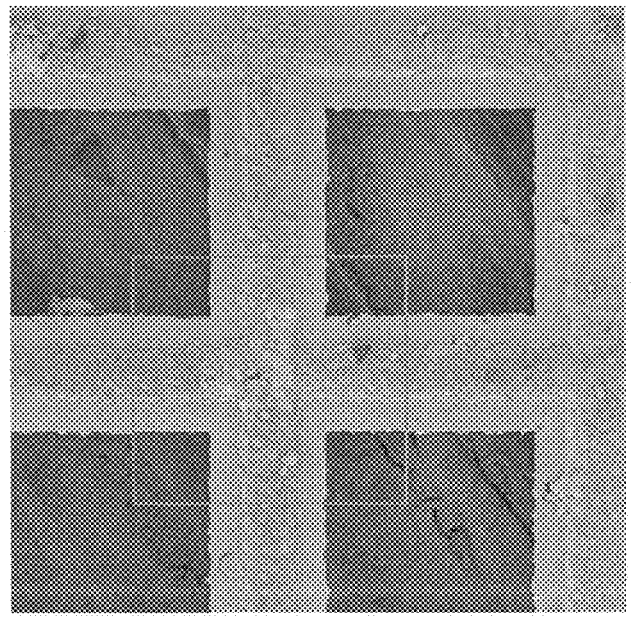
FIG. 11 is a view (SEM image) illustrating an example of a reference image.

FIG. 11 is view (image (SEM image)) illustrating an example of the reference image that includes the template image. In FIG. 11, the area enclosed by the square corresponds to the template image.

As illustrated in FIG. 11, the template image is an image obtained by designating part of the reference image photographed using the electron beam optical system 20.

Figure 12:
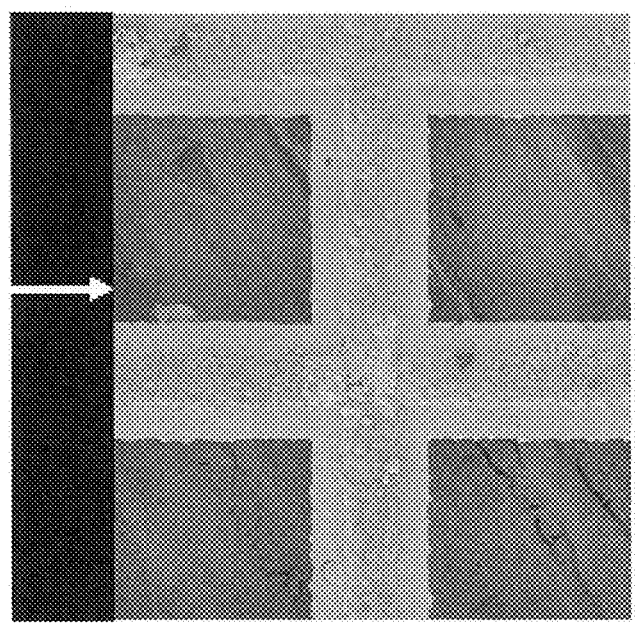
FIG. 12 is a view (image) illustrating an example of a first comparative image generated by moving a field of view in an X-direction by performing image processing.
Figure 13:
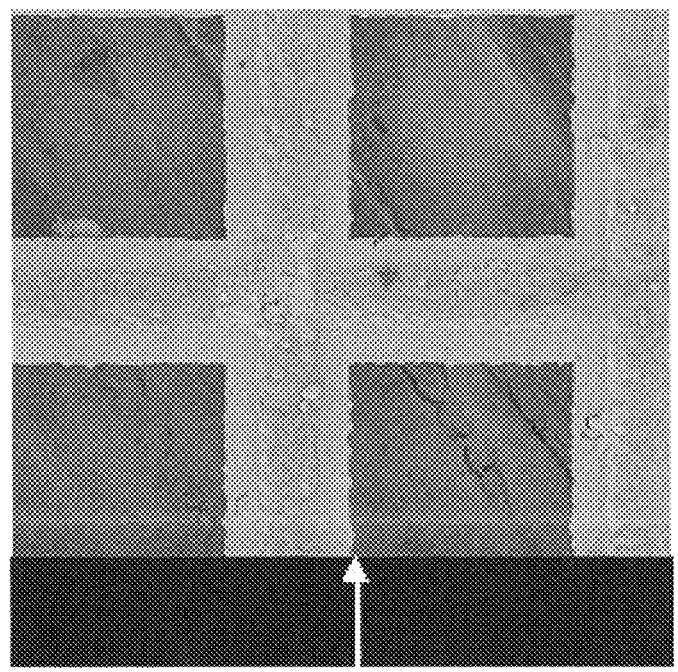
FIG. 13 is a view (image) illustrating an example of a second comparative image generated by moving a field of view in a Y-direction by performing image processing.

FIG. 12 is a view (image) illustrating an example of the first comparative image generated by moving the field of view in the X-direction by the first moving amount by performing image processing. FIG. 13 is a view (image) illustrating an example of the second comparative image generated by moving the field of view in the Y-direction by the second moving amount by performing image processing.

The image processing section 210 performs image processing on the reference image illustrated in FIG. 11 to move the field of view in the X-direction by the first moving amount to generate the first comparative image (see FIG. 12).

Likewise, the image processing section 210 performs image processing on the reference image illustrated in FIG. 11 to move the field of view in the Y-direction by the second moving amount to generate the second comparative image (see FIG. 13). The image acquisition section 64 acquires the first comparative image and the second comparative image thus generated by the image processing section 210.

2.2. Image Evaluation Method

Figure 14:
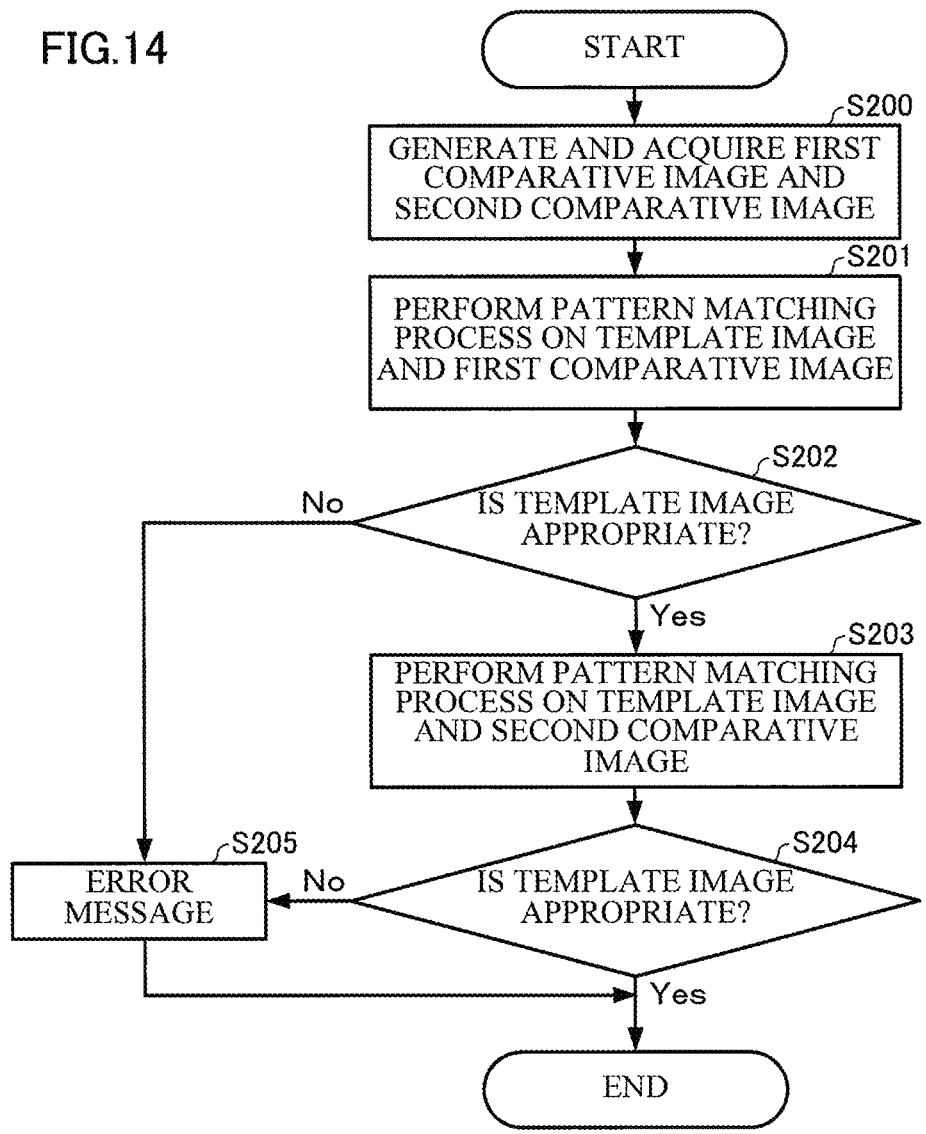
FIG. 14 is a flowchart illustrating an example of an image evaluation method that evaluates a template image used for a pattern matching process using a charged particle beam device according to the second embodiment.

An image evaluation method that evaluates the template image used for the pattern matching process using the charged particle beam device according to the second embodiment is described below with reference to the drawings. FIG. 14 is a flowchart illustrating an example of the image evaluation method that evaluates the template image using the charged particle beam device 200 according to the second embodiment.

When the template image has been acquired in the step S10 (see FIG. 6), the image processing section 210 performs image processing on the reference image to generate the first comparative image and the second comparative image. The image acquisition section 64 acquires the first comparative image and the second comparative image generated by the image processing section 210 (step S200).

The evaluation section 66 performs the pattern matching process on the template image and the first comparative image (step S201). The evaluation section 66 thus calculates the shift amount Dx between the position of the template image in the reference image and the position of the template image in the first comparative image.

The evaluation section 66 then determines whether or not the template image is appropriate based on the result of the pattern matching process (step S202). The evaluation section 66 evaluates the template image from the ratio Dx/Lx of the shift amount Dx calculated in the step S201 to the first moving amount Lx.

When it has been determined that the template image is appropriate as a result of the pattern matching process (Yes in step S202), the evaluation section 66 performs the pattern matching process on the template image and the second comparative image (step S203). The evaluation section 66 thus calculates the shift amount Dy between the position of the template image in the reference image and the position of the template image in the second comparative image.

The evaluation section 66 then determines whether or not the template image is appropriate based on the result of the pattern matching process (step S204). The evaluation section 66 evaluates the template image from the ratio Dy/Ly of the shift amount Dy calculated in the step S203 to the second moving amount Ly.

When it has been determined that the template image is appropriate as a result of the pattern matching process (Yes in step S204), the processing section 60 terminates the image evaluation process.

When it has been determined that the template image is not appropriate as a result of the pattern matching process (No in step S202 or No in step S204), the evaluation section 66 performs a control process that displays the evaluation result for the template image in the X-direction and the evaluation result for the template image in the Y-direction on the display section 72, for example (step S205). The processing section 60 then terminates the image evaluation process.

The reference image can be evaluated by performing the above process.

The charged particle beam device 200 and the image evaluation method according to the second embodiment can achieve the same advantageous effects as those achieved by the charged particle beam device and the image evaluation method according to the first embodiment.

Since the charged particle beam device 200 and the image evaluation method according to the second embodiment can generate the first comparative image and the second comparative image by performing image processing, the time required for photographing can be reduced as compared with the case of generating the first comparative image and the second comparative image by photographing the specimen S, for example, and it is possible to efficiently evaluate the template image.

2.3. Modification

A modification of the charged particle beam device 200 according to the second embodiment is described below. Note that the configuration of the charged particle beam device according to the modification is the same as that of the charged particle beam device 200 illustrated in FIG. 10, and description thereof is omitted. The following description focuses on the differences from the charged particle beam device 200, and description of the same features as those of the charged particle beam device 200 is omitted.

The charged particle beam device 200 is configured so that the image processing section 210 generates the first comparative image and the second comparative image by performing image processing on the reference image, and the evaluation section 66 performs the pattern matching process on the template image and the first comparative image to evaluate the template image in the X-direction and performs the pattern matching process on the template image and the second comparative image to evaluate the template image in the Y-direction.

According to the modification, the image processing section 210 generates the third comparative image by moving the field of view in the X-direction by the first moving amount and in the Y-direction by the second moving amount by performing image processing on the reference image, and the evaluation section 66 performs the pattern matching process on the template image and the third comparative image and evaluates the template image.

The evaluation section 66 performs the pattern matching process on the template image and the third comparative image and evaluates the template image. For example, the evaluation section 66 calculates the shift amount Dx in the X-direction and the shift amount Dy in the Y-direction between template image and the third comparative image by performing the pattern matching process. The evaluation section 66 evaluates the template image from the ratio Dx/Lx of the shift amount Dx in the X-direction to the first moving amount Lx and the ratio Dy/Ly of the shift amount Dy in the Y-direction to the second moving amount Ly.

Figure 15:
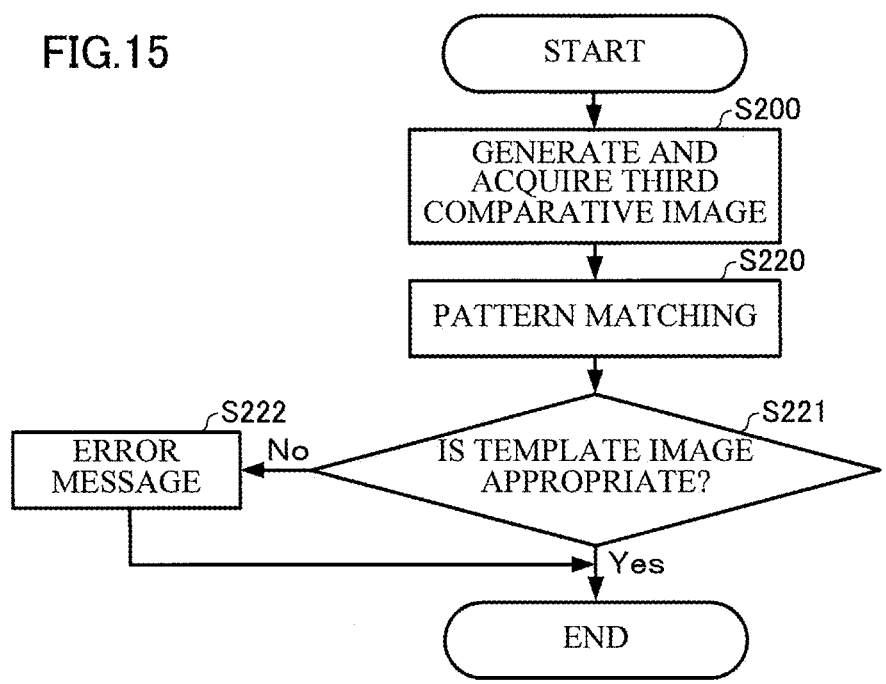
FIG. 15 is a flowchart illustrating an example of an image evaluation method that evaluates a template image used for a pattern matching process using a charged particle beam device according to the modification of the second embodiment.

FIG. 15 is a flowchart illustrating an example of the image evaluation method that evaluates the template image using the charged particle beam device according to the modification.

When the template image has been acquired in the step S10 (see FIG. 6), the image processing section 210 performs image processing on the reference image to generate the third comparative image. The image acquisition section 64 acquires the third comparative image generated by the image processing section 210 (step S200).

The evaluation section 66 performs the pattern matching process on the template image and the third comparative image (step S220). The evaluation section 66 thus calculates the shift amount Dx in the X-direction and the shift amount Dy in the Y-direction between the position of the template image in the reference image and the position of the template image in the third comparative image.

The evaluation section 66 then determines whether or not the template image is appropriate based on the result of the pattern matching process (step S221). The evaluation section 66 evaluates the template image from the ratio Dx/Lx of the shift amount Dx calculated in the step S220 to the first moving amount Lx and the ratio Dy/Ly of the shift amount Dy calculated in the step S220 to the second moving amount Ly. The evaluation section 66 determines that the template image is appropriate when it has been determined that the template image is appropriate in the X-direction and the Y-direction and determines that the template image is not appropriate when it has been determined that the template image is not appropriate in at least one of the X-direction and the Y-direction.

When it has been determined that the template image is appropriate as a result of the pattern matching process (Yes in step S221), the processing section 60 terminates the image evaluation process.

When it has been determined that the template image is not appropriate as a result of the pattern matching process (No in step S221), the evaluation section 66 performs a control process that displays the evaluation result for the template image in the X-direction and the evaluation result for the template image in the Y-direction on the display section 72, for example (step S222). The processing section 60 then terminates the image evaluation process.

The reference image can be evaluated by performing the above process.

The charged particle beam device and the image evaluation method according to the modification can achieve the same advantageous effects as those achieved by the charged particle beam device and the image evaluation method according to the second embodiment. According to the modification, since the template image can be evaluated using one comparative image, the time required to acquire the comparative image can be reduced as compared with the case of evaluating the template image using two comparative images, for example.

3. Additional Embodiments

The invention is not limited to the above embodiments. Various modifications and variations may be made without departing from the scope of the invention.

Although an example in which the charged particle beam devices 100 and 200 are an FIB-SEM has been described above, the charged particle beam device according to the invention is not limited to an FIB-SEM. The charged particle beam device according to the invention may be an electron microscope such as a scanning electron microscope (SEM), a transmission electron microscope (TEM), or a scanning transmission electron microscope (STEM), a device that includes an electron microscope and a detector such as an energy-dispersive X-ray spectroscopy detector (EDS detector), a wavelength-dispersive X-ray spectroscopy detector (WDS detector), or an electron backscatter diffraction detector (EBSD detector), a critical dimension SEM or an electron beam exposure device provided in a semiconductor production line, or the like.

Although an example in which the image evaluation method according to the invention that evaluates the template image is applied to the continuous photographing process that is implemented by an FIB-SEM and used to reconstruct a three-dimensional image has been described above, the image evaluation method according to the invention is not limited thereto. For example, a drift correction process is performed using a pattern matching process when continuously acquiring an image or data for a long time using an electron microscope or the like. The image evaluation method according to the invention may be applied when evaluating a template image used for such a pattern matching process.

The invention includes various other configurations substantially the same as the configurations described in connection with the above embodiments (e.g., a configuration having the same function, method, and results, or a configuration having the same objective and effects). The invention also includes a configuration in which an unsubstantial element described in connection with the above embodiments is replaced by another element. The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. An image evaluation method that evaluates a template image used for a pattern matching process that is implemented in a charged particle beam device, the image evaluation method comprising:
   a template image acquisition step that designates part of a reference image to acquire the template image;
   a first comparative image acquisition step that acquires a first comparative image in which a position of the template image is moved in a first direction by a first moving amount relative to the reference image;
   a first evaluation step that performs the pattern matching process on the template image and the first comparative image and evaluates the template image;
   a second comparative image acquisition step that acquires a second comparative image in which the position of the template image is moved in a second direction that is orthogonal to the first direction by a second moving amount relative to the reference image; and
   a second evaluation step that performs the pattern matching process on the template image and the second comparative image and evaluates the template image.

2. The image evaluation method as defined in claim 1, wherein the first evaluation step calculates a shift amount between the position of the template image in the reference image and the position of the template image in the first comparative image by performing the pattern matching process and evaluates the template image from a ratio of the shift amount to the first moving amount, and
   the second evaluation step calculates a shift amount between the position of the template image in the reference image and the position of the template image in the second comparative image by performing the pattern matching process and evaluates the template image from a ratio of the shift amount to the second moving amount.

3. The image evaluation method as defined in claim 1, wherein the first comparative image acquisition step acquires the first comparative image by photographing the first comparative image after moving an observation field of view using the charged particle beam device, and
   the second comparative image acquisition step acquires the second comparative image by photographing the second comparative image after moving the observation field of view using the charged particle beam device.

4. The image evaluation method as defined in claim 1, wherein the first comparative image acquisition step acquires the first comparative image by moving a field of view by performing image processing on the reference image, and
   the second comparative image acquisition step acquires the second comparative image by moving the field of view by performing image processing on the reference image.

5. An image evaluation method that evaluates a template image used for a pattern matching process that is implemented in a charged particle beam device, the image evaluation method comprising:
   a template image acquisition step that designates part of a reference image to acquire the template image;
   a comparative image acquisition step that acquires a comparative image in which a position of the template image is moved in a first direction by a first moving amount and in a second direction that is orthogonal to the first direction by a second moving amount relative to the reference image; and an evaluation step that performs the pattern matching process on the template image and the comparative image and evaluates the template image.

6. The image evaluation method as defined in claim 5, wherein the evaluation step calculates a shift amount in the first direction and a shift amount in the second direction between the position of the template image in the reference image and the position of the template image in the comparative image by performing the pattern matching process and evaluates the template image from at least one of a ratio of the shift amount in the first direction to the first moving amount and a ratio of the shift amount in the second direction to the second moving amount.

7. The image evaluation method as defined in claim 5, wherein the comparative image acquisition step acquires the comparative image by photographing the comparative image after moving an observation field of view using the charged particle beam device.

8. The image evaluation method as defined in claim 5, wherein the comparative image acquisition step acquires the comparative image by moving a field of view by performing image processing on the reference image.

9. A charged particle beam device that applies a charged particle beam to a specimen to acquire an image, the charged particle beam device comprising:
   an image acquisition section that acquires a template image obtained by designating part of a reference image, a first comparative image in which a position of the template image is moved in a first direction by a first moving amount relative to the reference image, and a second comparative image in which the position of the template image is moved in a second direction that is orthogonal to the first direction by a second moving amount relative to the reference image; and
   an evaluation section that performs a pattern matching process on the template image and at least one of the first comparative image and the second comparative image and evaluates the template image.

10. The charged particle beam device as defined in claim 9, wherein the evaluation section calculates a shift amount between the position of the template image in the reference image and the position of the template image in the first comparative image by performing the pattern matching process, evaluates the template image from a ratio of the shift amount between the position of the template image in the reference image and the position of the template image in the first comparative image to the first moving amount, calculates a shift amount between the position of the template image in the reference image and the position of the template image in the second comparative image by performing the pattern matching process, and evaluates the template image from a ratio of the shift amount between the position of the template image in the reference image and the position of the template image in the second comparative image to the second moving amount.

11. The charged particle beam device as defined in claim 9, wherein the first comparative image and the second comparative image are images photographed after moving an observation field of view.

12. The charged particle beam device as defined in claim 9, wherein the first comparative image and the second comparative image are images obtained by moving a field of view by performing image processing on the reference image.

13. A charged particle beam device that applies a charged particle beam to a specimen to acquire an image, the charged particle beam device comprising:
   an image acquisition section that acquires a template image obtained by designating part of a reference image and a comparative image in which a position of the template image is moved in a first direction by a first moving amount and in a second direction that is orthogonal to the first direction by a second moving amount relative to the reference image; and
   an evaluation section that performs a pattern matching process on the template image and the comparative image and evaluates the template image.

14. The charged particle beam device as defined in claim 13, wherein the evaluation section calculates a shift amount in the first direction and a shift amount in the second direction between the position of the template image in the reference image and the position of the template image in the comparative image by performing the pattern matching process, and evaluates the template image from at least one of a ratio of the shift amount in the first direction to the first moving amount and a ratio of the shift amount in the second direction to the second moving amount.

15. The charged particle beam device as defined in claim 13, wherein the comparative image is an image photographed after moving an observation field of view.

16. The charged particle beam device as defined in claim 13, wherein the comparative image is an image obtained by moving a field of view by performing image processing on the reference image.

* * * * *